(12) United States Patent
Blösch et al.

(10) Patent No.: US 10,362,703 B2
(45) Date of Patent: Jul. 23, 2019

(54) ELECTRIC MOTOR INVERTER

(71) Applicant: Conti Temic microelectronic GmbH, Nürnberg (DE)

(72) Inventors: Christoph Blösch, Bubenreuth (DE); Bjoern Toberer, Greußenheim (DE)

(73) Assignee: CPT Zwei GmbH, Hannover (DE)

( * ) Notice: Subject to any disclaimer, the term of this patent is extended or adjusted under 35 U.S.C. 154(b) by 0 days.

(21) Appl. No.: 15/947,989

(22) Filed: Apr. 9, 2018

(65) Prior Publication Data

US 2018/0228048 A1    Aug. 9, 2018

Related U.S. Application Data

(63) Continuation of application No. PCT/EP2016/072451, filed on Sep. 21, 2016.

(30) Foreign Application Priority Data

Oct. 9, 2015   (DE) .................. 10 2015 219 643

(51) Int. Cl.
| | |
|---|---|
| H05K 5/00 | (2006.01) |
| H05K 7/00 | (2006.01) |
| H05K 7/14 | (2006.01) |
| H02M 7/00 | (2006.01) |
| H05K 5/02 | (2006.01) |
| H05K 7/20 | (2006.01) |

(52) U.S. Cl.
CPC .......... *H05K 7/1432* (2013.01); *H02M 7/003* (2013.01); *H05K 5/0217* (2013.01); *H05K 7/2039* (2013.01); *H05K 7/2089* (2013.01)

(58) Field of Classification Search
CPC .................................................. H05K 7/1432
See application file for complete search history.

(56) References Cited

U.S. PATENT DOCUMENTS

| | | | |
|---|---|---|---|
| 6,166,937 A | 12/2000 | Yamamura et al. | |
| 6,867,970 B2* | 3/2005 | Muller | H05K 7/20909 165/104.33 |
| 2010/0259898 A1* | 10/2010 | Kimura | H05K 7/209 361/704 |

FOREIGN PATENT DOCUMENTS

| | | |
|---|---|---|
| DE | 19717550 A1 | 10/1998 |
| DE | 10029122 A1 | 7/2001 |
| DE | 10103106 A1 | 12/2001 |
| DE | 102011105346 A1 | 12/2012 |

OTHER PUBLICATIONS

German Office Action dated Apr. 14, 2016 corresponding to German Patent Application No. 10 2015 219 643.7.
International Search Report and Written Opinion dated Dec. 12, 2016 from corresponding International Patent Application No. PCT/EP2016/072451.

\* cited by examiner

*Primary Examiner* — Jerry Wu (57) ABSTRACT

An electric motor inverter includes at least one DC-link capacitor that has contacting layers. The electric motor inverter also includes circuit breakers which are mounted on at least one substrate, and capacitor connecting plates which are attached with first sections to the contacting layers. Second sections of the capacitor connecting plates which are arranged opposite the first sections are attached to the at least one substrate.

10 Claims, 3 Drawing Sheets

ELECTRIC MOTOR INVERTER

CROSS-REFERENCE TO RELATED APPLICATIONS

This application is a continuation of International application No. PCT/EP2016/072451, filed Sep. 21, 2016, which claims priority to German application No. 10 2015 219 643.7, filed on Oct. 9, 2015, each of which is hereby incorporated by reference herein in its entirety.

TECHNICAL FIELD

The disclosure relates to an electric motor inverter.

BACKGROUND

An electric machine may be used as the sole drive or as an additional drive of a motor vehicle. In addition, electric machines are used, for example, for starting internal combustion engines.

In mobile applications in vehicles, requirements with respect to the space required and the vibration resistance occur, in particular, for the power electronics. In addition, it is necessary to ensure that excessively strong interference signals are not output even when there are high currents and high switching frequencies.

SUMMARY

Therefore, possible ways of implementing an electric motor inverter which allows for at least one of the above-mentioned criteria are disclosed below.

The inverter described here serves to convert direct voltage (for example of a motor vehicle on-board power system) into an alternating signal which is suitable for supplying an electric machine, such as, a synchronous machine or an asynchronous machine, in order to drive it. The inverter may be used within an electric traction drive, within a starter or within a starter generator (for example, a belt starter generator or an integrated starter generator, ISG). The inverter may be a unidirectional or bidirectional, i.e. may also be used to generate electrical power (from mechanical power).

Implementations of the disclosure may include one or more of the following optional features. In some implementations, the inverter is a three-phase inverter, and may include a B6C bridge. The inverter may also be designed for more than three phases (for example six).

In some examples, the inverter has a DC-link capacitor and circuit breakers. The DC-link capacitor is connected to the circuit breakers and is, as illustrated here, connected directly to the substrate of the circuit breakers or directly to the circuit breakers. A direct connection between the DC-link capacitor and circuit breakers is proposed by making the capacitor connection plates reach as far as the circuit breakers or as far as the substrate which carries them.

In some examples, film capacitors are used as the DC-link capacitor, where individual film sections are stacked one on top of the other and electrodes are alternately connected to two contacting layers. As is known this results in two comb-shaped structures which engage one inside the other and are separated by insulator layers. The comb-shaped structures are formed, on the one hand, by the individual electrodes, comparable to the prongs of a comb, and, on the other hand, by a contact layer and a connecting plate which is welded or soldered (generally: attached) onto the contact layer. The contact layer and the connecting plate may be considered to be a bus bar for the individual electrodes. The contact layer and the connecting plate are comparable to the handle section of a comb from which the prongs of the comb protrude.

The connecting plate of the capacitor ("capacitor connecting plate") is made to extend (for each of the two electrical connections of the capacitor) from the DC-link capacitor as far as the substrate of the circuit breakers or as far as the circuit breakers themselves. The two connecting plates of the capacitor (i.e. the capacitor connecting plates) extend, for example, in parallel and one on top of the other (for example, separated by an insulation layer).

The electric motor inverter has a DC-link capacitor. The capacitor connecting plates thereof lead directly to the substrate or to the contacts thereof (solder faces). Circuit breakers are mounted on the substrate and therefore in direct contact with low inductivity with the DC-link capacitor. The capacitor connecting plates have first sections which are located directly on the capacitor (i.e. are attached to the contact layer). Second sections (opposing the latter) are mounted on the substrate. For example, surface sections on one of the two wide sides of the plate are referred to as sections. The two sections may be end sections. In some examples, the first sections can also be end sections, but the capacitor plates can be made to extend onward, for example, to form an EMC filter. In this case, the sections which extend to the filter are end sections, and the first sections are located between the two end sections (i.e. between the filter and the substrate).

The capacitor connecting plates extend between the DC-link capacitor and the substrate in parallel and one on top of the other (but electrically insulated from one another). This applies at least to the sections of the capacitor connecting plates between the DC-link capacitor and the substrate. The edges of the capacitor connecting plates which lead from the DC-link capacitor to the substrate are essentially aligned with one another. In some examples, at most only a small portion of the overall surface of one of the capacitor connecting plates protrudes opposite the other capacitor connecting plate, for example a portion of less than 10%, 5%, 2% or 1%.

The above description relates to a single-phase structure or just one phase of the inverter. In the case of N phases, N or N*k1 DC-link capacitors, N or N*k2 substrates and 2*N or 2*N*k1 capacitor connecting plates are used (where N, k1 and k2 are each natural numbers greater than one).

In addition, a single phase or multi-phase electric motor inverter is described. The latter has at least one DC-link capacitor. The at least one DC-link capacitor has contacting layers, for example two (i.e. one layer for each capacitor connection). Each of the DC-link capacitors may have two contacting layers.

The electric motor inverter has circuit breakers. They are mounted on at least one substrate. The number of substrates can correspond to the number of phases, or can be an integral multiple thereof. The number of circuit breakers on one of the substrates may an integral multiple of the phases. At least two circuit breakers or two groups of circuit breakers are provided for each phase. In each group, the circuit breakers may be connected in parallel so as to multiply the switching power. All the circuit breakers can be mounted on one substrate, even in the case of multi-phase (3 phase or more) inverters. However, in some examples, one substrate is provided per phase. Two substrates may also be provided per phase. In some examples, an even-numbered multiple of substrates is provided per phase.

The electric motor inverter additionally includes, as mentioned, capacitor connecting plates which connect one or more DC-link capacitors to the at least one substrate. The capacitor connecting plates extend from the at least one DC-link capacitor to the at least one substrate or the power semiconductors thereof. In some examples, two capacitor connecting plates are provided per DC-link capacitor. The capacitor connecting plates may be stacked one on top of the other (with an insulation layer between them) and are aligned with another. The capacitor connecting plates of a capacitor may have the same thickness and the same width. The capacity connecting plates of one capacitor may be of different lengths, for example if one contacting layer of the capacitor is closer to the substrate than the other. There may be a normal line of the contacting layer which points essentially to the substrate. The capacitor connecting plates may each have at least one bend which runs from one long side of the capacitor connecting plates, which run parallel to one another, to the other, for example perpendicularly with respect to the long side.

The capacitor connecting plates are attached with first ends on the contacting layers. Second ends of the capacitor connecting plates which are opposite the latter are attached to the at least one substrate.

The capacitor connecting plates of one of the DC-link capacitors lie one on top of the other. The capacitor connecting plates of one of the DC-link capacitors are insulated from one another by an insulation layer. This applies to each of the DC-link capacitors. If just one of the DC-link capacitors is present, the capacitor connecting plates lie one on top of the other and may be isolated from one another by an insulation layer. When there are a plurality of DC-link capacitors, the capacitor connecting plates of each of the DC-link capacitors lie one on top of the other and may be isolated from one another by an insulation layer. The capacitor connecting plates of different DC-link capacitors may lie one next to the other. When the terms "one next to the other" and "one on top of the other" are used, the plane of the substrate can be used as a reference point. "One next the other" means that two objects are spaced apart from one another in one main direction of the at least one substrate (or in parallel with the main direction). "One on top of the other" means spacing apart in one direction of a normal line of the substrate.

In some examples, the insulation layer rests directly on both capacitor connecting plates. The insulation layer may be formed by a surface coating layer which is provided on one or on both capacitor connecting plates. The insulation layer may be a layer made of an electrically insulating material. The insulation layer may have a dielectric strength of at least 400 V, 600 V, 1200 V or 1600 V or more. The insulation layer extends at least along the longitudinal section of the capacitor connecting plates in which they are placed one on top of the other (separately from the insulation layer). In some examples, a plurality of insulation layers is also provided between the capacitor connecting plates, which insulation layers can be of the same type or different, for example at least one surface coating layer and one insulation layer made of plastic.

The capacitor connecting plates may extend over parts of the substrate, for example over a large part or essentially over the entire substrate. Therefore, at least part of the substrate, such as a large part of the substrate or the entire substrate, extends between connecting points at which the capacitor connecting plates are connected to the substrate, or an edge of the substrate facing away from the DC-link capacitor, and the DC-link capacitor itself. The substrate or the substrates is/are at least partially, for example for the most part or completely, covered by the capacitor connecting plates. As a result, a screen effect is produced for the substrate. In addition, the capacitor connecting plates can extend over part of the circuit breakers, over a large part of the circuit breakers or over all the circuit breakers. An insulation layer and/or a spacer element may be provided between the capacitor connecting plates and the substrate.

The electric motor inverter may also have a base plate. The DC-link capacitor and the substrate may be attached one next to the other on the baseplate, but the capacitor may also be arranged under the module. An underside of the DC-link capacitor is attached to the base plate, for example via a heat pad, i.e. a heat-conducting layer which can be electrically insulating. Instead of a heat pad, or in combination therewith, a heat conducting paste can also be used. One side of the DC-link capacitor, which is at an angle with respect to the underside (for example, approximately 90°) faces to the substrate (or to the substrates). The capacitor connecting plates project from the DC-link capacitor from the side, for example from the edge, between this side and the underside, and extend to the at least one substrate or else at least partially beyond the substrate. The at least one substrate is also attached to the base plate, for example in a materially joint fashion such as e.g. soldered, i.e. a heat-conducting layer which can be electrically insulating. Instead of a heat pad, or in combination therewith, a heat conducting paste may also be used. The at least one substrate may be mounted on a ceramic layer which is directly attached to the baseplate or the heatsink, for example a cold-gas-injected layer, which is applied directly to the baseplate or the heatsink. This can also be provided for the DC-link capacitor. Instead of the attachment of the substrate, the circuit breakers may also be mounted directly in the way described for the substrate.

The baseplate may have a heatsink. The heatsink may be at least partially let into the baseplate at the section of the baseplate to which the at least one substrate is attached. The baseplate may, for this purpose, have a cutout which extends through the entire thickness of the baseplate. The heatsink may be at least partially let into the cutout in the baseplate. The heatsink has a rear side on which the substrate is attached. In this sense, the heat sink may be considered to be part of the baseplate, with the result that the at least one substrate is attached to this part of the baseplate in a heat-transmitting manner. At the point at which the DC-link capacitor is attached, it is also possible to let a heatsink into the baseplate. This can be formed by a further heatsink, or a common heat sink is let into the baseplate, to which heatsink the at least one substrate and the DC-link capacitor are attached. The attachment to the heatsink is such that heat can be transmitted to the baseplate.

In some examples, the heatsink is equipped with cooling pins or cooling fins (or other structures for increasing the size of the surface). The cooling pins or cooling fins extend into the cutout. The cooling pins or cooling fins extend to one side of the baseplate which is opposite to that side which carries the DC-link capacitor or the at least one substrate. The cooling pins or cooling fins extend into the cutout from a front side, arranged opposite the rear side, of the heatsink.

In some examples, the baseplate has a cover plate which closes off the cutout in a seal-forming fashion on the same side of the baseplate which is arranged opposite the substrate (or the side on which the DC-link capacitor or the substrate are located). This produces a cavity between the rear side of the heatsink and the cover plate. This cavity is used as a cooling duct. A fluid-tight cooling duct is therefore produced between the front side of the heatsink and the cover plate.

Openings that extend to the cavity or to the cooling duct and which form the inflow and outflow of the cooling duct are provided in the baseplate.

In some examples, the DC-link capacitor is arranged in a metal housing. The metal housing may be a cast housing or a sheet-metal housing. The metal housing is adjoined by arms that extend from the metal housing over at least one section of the substrate. The arms are connected in a force-transmitting fashion to the substrate and/or to at least one further circuit board of the electric motor inverter. One end of the arms is connected to the metal housing. The opposite end of the arms is attached to the substrate and/or to the at least one further circuit board. The arms and the metal housing may be embodied together (i.e. in one piece); the connection is formed by the continuation of the metal housing to the arms. In some examples, this connection is a materially-joint connection and can also be configured as a soldered connection, but can also be implemented as a positively-locking connection.

The DC-link capacitor has a sheath, for example made of plastic. The sheath surrounds the contacting layers and, for example, film sections and electrodes of the capacitor. The sheath surrounds only some of the capacitor connecting plates, for example only the ends of the capacitor connecting plates which are attached to the contacting layer. The rest of the sections of the capacitor connecting plates are not surrounded by the sheath. The sheath corresponds to a capacitor housing. The sheath is arranged directly on the inner side of the metal housing.

In some implementations, the electric motor inverter has a driver circuit board. The latter has a driver circuit. The power switches are arranged downstream of the driver circuit of this circuit board. The connection between this circuit board and the substrate or the power switches may be a connection by press-fit pins.

In some examples, the driver circuit board extends along the substrate. The driver circuit board may be arranged offset with respect to the substrate (in the perpendicular direction with respect to the substrate). The driver circuit board may therefore extend in parallel with the substrate or the baseplate. In addition, the driver circuit board may be secured on a carrier plate. The carrier plate may be a metal plate. The carrier plate is rigid. The driver circuit board is bonded onto the carrier plate. The driver circuit board is insulated with respect to the carrier plate, for example if the latter is fabricated from a conductive material such as metal or a metal alloy.

The carrier plate of the driver circuit board may have at least one cutout. At least one electrical connection to the substrate or to the circuit breakers extends through this at least one cutout (which extends through the entire thickness of the carrier plate). The electrical connection may have at least one press-fit connection. The latter extends from the driver circuit board to the substrate or to a further connection (for example a conductor which is soldered onto the substrate or onto the circuit breakers).

A frame or a terminal strip may be provided, running around the at least one substrate or arranged next to it. The driver circuit board or the carrier plate thereof may rest on this frame or this terminal strip or be connected thereto. The frame or the terminal strip may have electrical connections which run through a wall of the frame or of the terminal strip. These electrical connections are connected to the substrate or to the circuit breakers.

The electric motor inverter can also have a control circuit board. The driver circuit board is arranged downstream of the control circuit board. While the driver circuit board is configured to generate actuation signals which may be processed by control inputs of the circuit breakers, the control circuit board serves to carry out superordinate functions, for example for closed-loop or open-loop control of the torque and/or rotational speed. The control circuit board may be connected to the driver circuit board via press fit connections. If the control circuit board is attached to a (further) carrier plate, the latter may also have a cutout through which electrical connections which connects the control circuit board to the driver circuit board run. As mentioned, the electrical connections may be implanted as press fit connections.

In some examples, the control circuit board is arranged above the driver circuit board (when viewed from the at least one substrate). This results in a stacked structure with the sequence: control circuit board—driver circuit board—substrate or circuit breaker—if appropriate baseplate. The control circuit board may be arranged parallel to the driver circuit board. The control circuit board may be spaced apart perpendicularly (in relation to the substrate or the baseplate) from the driver circuit board. The control circuit board extends along the substrate or the baseplate and is offset perpendicularly with respect to the substrate. The control circuit board is spaced apart from the substrate by a larger distance than the driver circuit board. The driver circuit board and the control circuit board are stacked one on top of the other and are spaced apart from one another.

The control circuit board can, as mentioned, be secured on a further carrier plate. This carrier plate may be embodied like the carrier plate of the driver circuit board. The control circuit board may be bonded onto the further carrier plate. The control circuit board may be electrically insulated with respect to the further carrier plate, for example if the carrier plate is configured from a metallic material.

At least one further control circuit board may be provided. The control circuit board may be attached to the metal housing of the DC-link capacitor. Further (equipped) circuit boards or switching modules may be provided. They can be mounted on the metal housing of the DC-link capacitor or on the baseplate.

The control circuit board by at least one first screw connection may be secured on the driver circuit board. As a result, in the event of vibrations, the movements are synchronized and a diametrically opposite movement of the two circuit boards, which may cause damage, is reduced. The control circuit board may be attached directly to the baseplate by second screw connections. As a result, even relative movements between the control circuit board and the baseplate are suppressed.

The at least one first screw connection is located essentially in the center between two of the screw connections. For example, the at least one first screw connection is located in the center between two of the screwed connections which are attached to opposite edge regions of the control circuit board. As a result, oscillation within a control circuit board is prevented, especially since the screwed connection is positioned at a location at which the maximum deflection would occur in the case of vibrations (if there were no screwed connection). Instead of the definition "in the center", it could also be formulated that the screwed connection or connections is/are located where they have the strongest effect in preventing oscillations of the circuit board. In other words, the first and/or second screwed connections are provided at locations on the circuit boards which are furthest away from other attachments. A spacer sleeve may be provided to secure the circuit boards to one another by the respective screwed connection.

In addition, the electric motor inverter may have an EMC filter. An EMC filter is a low-pass filter that filters out interferences which arise as a result of switching processes of the circuit breakers, from input connections and output connections of the electric motor inverter. The EMC filter includes at least one capacitor and at least one throttle. The EMC filter is arranged on one side of the DC-link capacitor, for example, on the side which is opposite the side of the DC-link capacitor which is attached to the baseplate. The EMC filter is arranged offset along the contacting layers, i.e. the EMC filter is provided as an extension of the contacting layers. In other words, the EMC filter is located on the DC-link capacitor or on the metal housing in which the DC-link capacitor is accommodated. The EMC filter may be accommodated in a filter housing (also a metal housing). The filter housing is attached directly to the metal housing of the DC-link capacitor. The filter housing may be a cast housing or a sheet-metal housing. An input connection, for example in the form of a plug-type connector element or screw-type connector element or in the form of at least one connection lug, may be provided in the filter housing. In addition, a feed connection for connecting the EMC filter to the substrate, to the circuit breakers and/or to the DC-link capacitor may be provided in the filter housing. The feed connection may be a plug-type connector element, screw-type connector element or as a contact lug. The metal housing of the DC-link capacitor may have an opening which faces away from the DC-link capacitor (for example along a normal line of the baseplate or an upper side of the capacitor). Connecting lugs may be provided which extend from the interior of the metal housing of the DC-link capacitor (or from the DC-link capacitor) through the opening. In addition, the EMC filter may have connections which are connected to these connecting lugs and are aligned with them. Sections of the capacitor connecting plates may project through the metal housing of the DC-link capacitor, for example through an opening in this metal housing. In some examples, the sections of the capacitor plates project toward the EMC filter, for example into the filter housing. The EMC filter may have filter components (for example capacitors and/or throttles) which are connected to these sections, for example via conductor tracks or via a solder connection which connects the sections of the capacitor connecting plates which project toward the filter to connections of at least one of the filter components. One section of the capacitor connecting plates may therefore be connected to the contacting layer, one (end) section may be attached to the substrate, and a second (end section) may be connected to the EMC filter (abbreviated to filter).

The circuit breakers are semiconductor switches, for example transistors such as IGBTs or MOSFETs or else thyristors. The circuit breakers may form a bridge circuit, for example a controllable bridge circuit, which may have a plurality of phases. The bridge circuit may be a three-phase or six-phase full-bridge circuit, but can also have a different number of phases, depending on the electric machine to be actuated. For example, the circuit breakers from a B6C bridge.

The baseplate may be constructed, for example, from aluminum or from an aluminum compound. The baseplate may be constructed in two parts. Here, a bottom plate may be provided on which a baseplate carrier plate is located. These components can be hard-soldered to one another. As a result, the cavity may be constructed in the baseplate. The heatsink can be a heatsink body which has a nickel layer for the purpose of attachment. As a result, the heatsink may be soldered onto the baseplate or into it (by the nickel layer). For example, the heatsink may be soldered onto one component or both components of the two-part baseplate, for example by hard solder.

In the case of a two-part structure of the baseplate, the bottom plate may have cooling fins or cooling pins which extend in the cavity. The base carrier plate which is applied thereto carries a heatsink which may be a plate, i.e. with or without cooling fins or cooling pins. The heatsink may be made of a copper material here and can have nickel layers which are applied for a better connection. The heatsink may also be a flat plate which serves merely as a termination of the cavity and for transmitting heat to the substrate.

A further possibility is to configure the heat sink as a hollow body, where the cooling fins or cooling pins extend in the hollow body. Such a heat sink would be attached to the baseplate or at least partially let into it. As a result, the complexity of the baseplate may be reduced, and already existing coolers may be used. Such coolers have two opposite walls between which the cooling fins extend. In addition, sidewalls may be provided in order to close off the space between the walls at least partially. Cutouts for inflows and outflows may be provided in the sidewalls or in at least one of the walls.

The details of one or more implementations of the disclosure are set forth in the accompanying drawings and the description below. Other aspects, features, and advantages will be apparent from the description and drawings, and from the claims.

DETAILED DESCRIPTION

Figure 1:
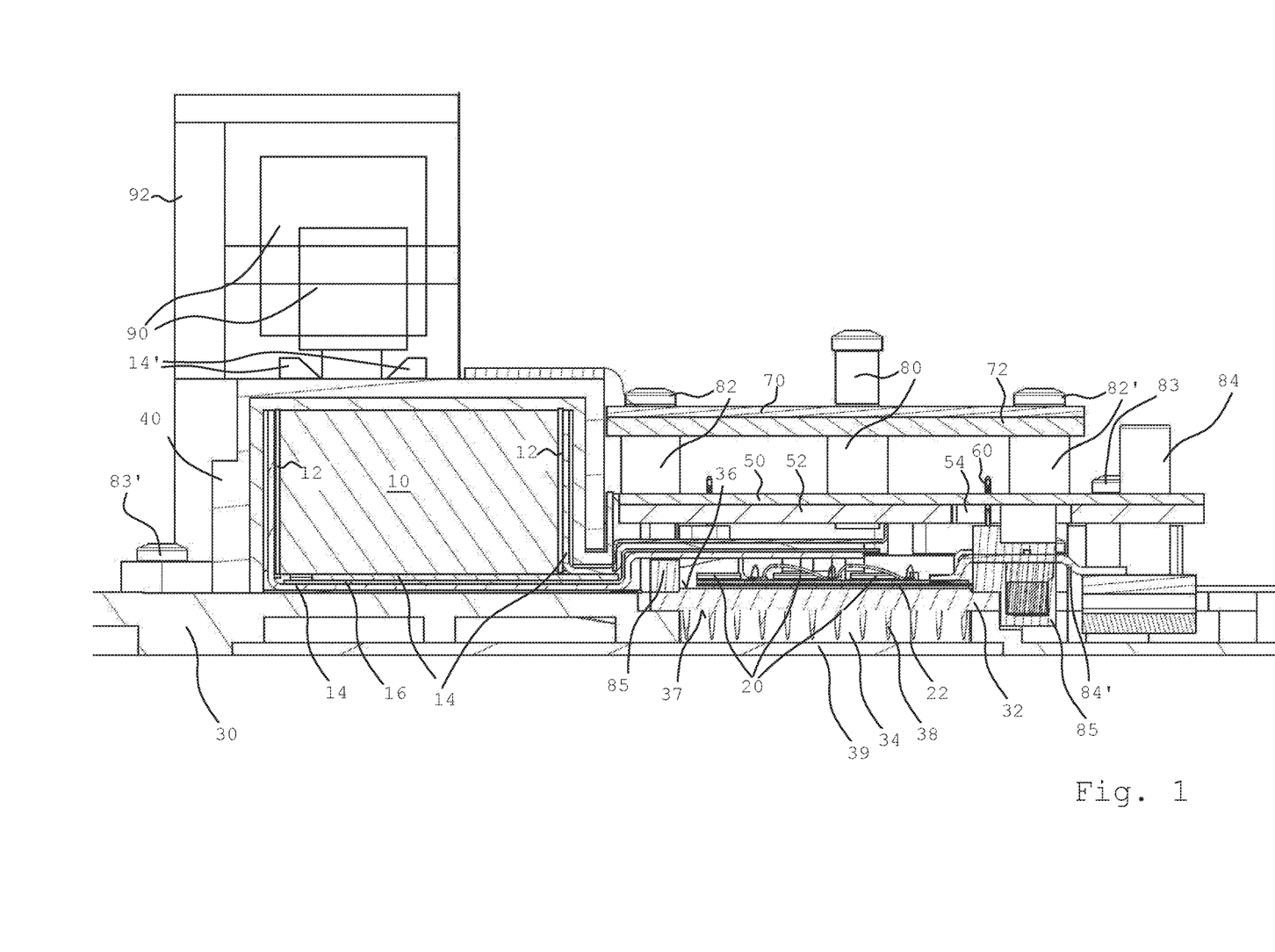
FIGS. 1-3 illustrate an exemplary electric motor inverter.
Like reference symbols in the various drawings indicate like elements.

FIG. 1 shows an electric motor inverter in cross-section with a DC-link capacitor 10 which has contacting layers 12. For better illustration, the individual insulated electrode layers that run perpendicularly with respect to the contacting layers 12 are not illustrated. The contacting layers 12 are two layers, illustrated on the right and left which are also known as Schoop layers. Capacitor connecting plates 14 are attached to these Schoop layers 12. Two capacity connecting plates are illustrated, where in each case, one plate is in electrical contact with one schoop layer 12. The contacting layers 12 and the capacitor connecting plates 14 are conductive and made, for example, from metal.

Sections of the capacitor connecting plates 14 are attached to the contacting layers 12, where connecting sections adjoin these sections, with the result that the capacitor connecting plates 14 extend, by the connecting sections, as far as circuit breakers 20 or a substrate 22. Furthermore, there are sections 14' of the capacitor connecting plates 14 which extend further to an EMC filter 90. The EMC filter 90 is located above the DC-link capacitor 10. The substrate 22 is located next to the DC-link capacitor. A section of one of the capacitor connecting plates 14 extends not only along one of the contacting layers but also along one side of the capacitor 10 which does not carry a contacting layer. This section reduces EMC interferences. This section runs between the capacitor 10 and the other capacitor connecting plate. This section is part of that capacity connecting plate which is connected to that contacting layer 12 which is located closer to the substrate 22 or closer to the circuit breakers 20.

The circuit breakers 20 are attached to the substrate 22. Three semiconductor switches 20 are illustrated in cross-section, where further circuit breakers may be provided in the plane of the drawing, for example a further group of three switches. The capacitor connecting plates have a section (for example, outside the DC-link capacitor or the housing 40) which extends not only to the substrate but also to the part above the substrate 22. Each capacity connecting plate 14 may have a tongue at one end of the section which is located on the substrate 22. The at least one tongue is guided from the position above the semiconductor switches 20 to the latter (or to the substrate 22). Conductor tracks which connect these end sections or tongues of the capacitor connecting plates 14 to the circuit breakers 20 may be provided on the substrate 22. Alternatively, the end sections of the capacitor plates 14 may be made to extend directly to the circuit breakers 20 or the contact faces thereof. One or more end sections in the form of tongues which extend to the substrate 22 or to the circuit breakers 20 may be provided per capacitor connecting plate 14.

The circuit breakers 20 may be housed or non-housed semiconductor switches, for example IGBTs. In addition, the power semiconductors have a control connection (base or gate) which is connected by bonding wires and/or conductor tracks. The substrate includes an insulating layer, on or in which conductive tracks are provided. The substrate 20 may be a ceramic substrate, but plastic substrates are also possible. Substrate materials with a high heat dissipation capability may be used, since a heatsink 32 is located directly underneath the substrate 20.

FIG. 1 shows a baseplate 30 in which both the DC-link capacitor 10 and the substrate 22 are arranged. The capacitor connecting plates 14 extend from the contacting layers 12 between the baseplate 30 and the DC-link capacitor 10. An insulation layer 16 between the baseplates serves as electrical insulation between the capacitor plates 14. The capacitor plates 14 (and therefore also the insulation layer 16) have a section which extends in a step shape and by which, starting from the DC-link capacitor 10, the capacitor connecting plates 14 are spaced apart from the baseplate 30, in order thereby to be able to extend above the substrate.

An (electrically insulating) frame element 85 has a section which is located between the DC-link capacitor 10 and the substrate 22, and supports the capacitor plates.

The baseplate 30 has a cutout 34 into which parts of the heatsink 32 are let. As shown, the section of the frame element 85 which is located between the substrate and the DC-link capacitor 10 supports the capacitor plates 14 with respect to the heatsink 32.

The heatsink 32 has a rear side 36 to which the substrate 22 is attached in a heat-transmitting fashion. The rear side 36 of the heatsink 32 faces the capacitor connecting plates 14. The heatsink 32 additionally has a front side 37 which is opposite the rear side 36. Cooling pins 38, which extend into the cutout 34 of the baseplate 30, protrude from the front side 37. The front side 37 of the heatsink 32, or the cooling pins 38 thereof, form one side of a cavity. The cavity is closed off on the underside of the baseplate 30 by a cover plate 39. The cooling pins 38 and the front side 37 face the cover plate 39. The side edges of the cavity are formed by the side faces of the cutout 34 of the baseplate 30. A cooling duct is formed within the cutout 34, which cooling duct is defined by the cutout 34 and by the front side 37 of the baseplate 30 and is closed off by the cover plate 39. The cover plate 39 and the heatsink 32 are connected in a fluid-tight manner to the baseplate 30, where for example sealing elements are used.

The baseplate also has cutouts underneath the DC-link capacitor 10, which cutouts are, however, not completely continuous (in contrast to the cutout 34). One or more grooves on the side of the baseplate 30, which faces the cover plate 39, result in a connection between the cutout 34 or the cooling duct underneath the heatsink 32 and the cutouts above the DC-link capacitor 10.

The electric motor inverter illustrated in FIG. 1 also has a driver circuit board 50 which is also located above the heatsink 32 or above the substrate 22, for example, above the circuit breakers 20 and also above a section of the capacitor connecting plates 14. Between the substrate 22 or the circuit breaker thereof and the driver circuit board 50, there is a section of the capacitor connecting plates 14 which connects the DC-link capacitor to the substrate 22. The circuit board 50 is fastened to a carrier plate 52, for example bonded tightly thereto. As a result, the stability of the driver circuit board 50 is increased.

A cutout 54 is provided in the carrier plate 52 of the driver circuit board 50. The driver circuit board 50 may be connected through this cutout to the substrate 22 or the circuit breaker 20 thereof or also to an external connection 84. In FIG. 1, a press-fit connection, i.e. one or more metal pins, extends through the cutout 54, where in FIG. 1 the metallic pin is let into the frame 85. The cutout 54 in the carrier plate 52 of the driver circuit board 50 is located between the driver circuit board 50 and the frame 85. In combination therewith or as an alternative thereto, at least one cutout which is located between the driver circuit board 50 and the substrate 22 or the circuit breakers 20 may be provided in the carrier plate 52. Press-fit connections between the driver circuit board 50 and the substrate 22 may likewise extend through such a cutout.

The electric motor inverter in FIG. 1 also has a control circuit board 70 which is located above the driver circuit board 50. The driver circuit board 50 is arranged downstream of the control circuit board 70. The substrate 22 or the circuit breaker 20 thereof is arranged downstream of the driver circuit board 50. The driver circuit board 50 is located between the control circuit board 70 and the substrate 20 or the heatsink 32. As a result, the two circuit boards 50, 70 are stacked one on top of the other. The control circuit board 70 is also attached to a carrier plate 72, for example by bonding. There are screwed connections 82, 82' which secure edge regions of the control circuit board 70 on the driver circuit board 50. The screwed connections 82, 82' also have spacer sleeves which are arranged between the driver circuit board 50 and the control circuit board 70 or the carrier plate 72 thereof. The screwed connections 82, 82' also extend underneath the driver circuit board 50 or the carrier plate 52 thereof to the heatsink or to the baseplate 30 or to the frame 85, in order to attach the circuit boards 70 and 50 or the carrier plates 52 and 72 thereof to the baseplate 30.

At least one further screwed connection 80 is located in a central region of the control circuit board 70 or of the driver circuit board 70, 50 or else in an edge region in the center between two further screwed connections 82. The screwed connection 80 connects the two circuit boards 50, 70 or the carrier plates 52, 72 thereof to one another. The screwed connection 80 is located between the screwed connections 82 and 82'. For example, the screwed connection 80 is located in a central region of the control circuit board or of the driver circuit board 70, 50. The connection, through the screwed connection 80, includes a screw bolt (above the control circuit board 70) and a spacer bolt which is located between the control circuit board 70 or the carrier plate 72 thereof and the driver circuit board 50. The screwed connection 80 prevents vibrations of the circuit boards, since it is fastened (without a screwed connection) at the location where an oscillation maximum would occur in the case of vibrations. In addition, the screwed connection 80 or else the screwed connections 82 (and 82') synchronizes/synchronize the movement between the two circuit boards, with the result that no relative movement may take place between the circuit boards 70 and 50 or such a relative movement is suppressed. The screw connection 80 may be considered to be a first screwed connection, while the screwed connections 82, 82' may be considered to be second screwed connections. The first screwed connection 80 serves to secure the two circuit boards 50, 70 underneath one another, while the second screwed connections 82, 82' serve to secure the circuit boards 50, 70 to the rest of the inverter. FIG. 1 illustrates that the first screwed connection 80 only connects the two circuit boards 50, 70 or the carrier plates 52, 72 thereof to one another, without, however, extending further underneath the carrier plate 52 of the driver circuit board 50 (as far as a screwing element, for example a nut). In some examples, the screwed connection 80 does not extend through the substrate 22 and is also not in direct contact with the heatsink 32 or with the baseplate 30.

A further screwed connection 83 extends between the driver circuit board 50 and the baseplate 30. The screwed connection 83 connects the driver circuit board 50 or the carrier plate 52 thereof directly to the baseplate 30. The further screwed connection 83 is located at an edge region of the driver circuit board 50 which is opposite an edge region at which the screwed connection 82 (i.e. one of the second screwed connections) is located.

A power connection 84 (for example, made of metallic material) extends on the side of the frame 85 which is opposite the DC-link capacitor 10. An electrical connection, such as a sheet-metal connection (i.e. a sheet-metal strip) which connects the power connection 84 to the substrate 22 through the frame 85 extends through the frame 85. Therefore, there is a metallic connecting element between the power connection 84 and the substrate 22, which connecting element extends through the frame 85 (laterally) and connects the two above-mentioned components directly to one another. The power connection 84 includes a base which is let into the baseplate 30. Likewise, the further screwed connection 83 may also attach this base to the baseplate. Since the base of the power connection 84 is located partially within the baseplate, the baseplate has a further cutout which does not extend through the entire thickness and which is open toward the side of the baseplate on which the DC-link capacitor 10 and the circuit boards 50, 70 as well as the substrate 20 are located. In addition, a screwed connection may be provided which secures the frame to the baseplate.

The DC-link capacitor 10 is located in a metal housing 40 which is open toward the baseplate 30. A gap through which the capacitor connecting plates 14 extend is located between the housing 40 and the baseplate 30, on a side of the housing 40 which faces the substrate 22. On the side of the housing 40 facing away from the baseplate 30 there is an opening through which further sections of the capacitor connecting plate 14 are located. These sections are referenced by the reference number 14'. An EMC filter, which is illustrated only as a sketch with outlines of the electrical components located there, is located on this side, i.e. on the side of the DC-link capacitor 10 which faces away from the baseplate 30. In some examples, at least one capacitor and at least one throttle which are assigned to the reference number 90 are located there. The latter are connected as a low-pass filter and connected to the sections 14' of the capacitor plates 14. The EMC filter is also accommodated with a housing 92. The housing 92 of the filter is located on the side of the metal housing 40 which faces away from the baseplate 30.

The housings 40 and 92 may be cast housings or a sheet of metal housings (for example made from folded sheet metal or from deep-drawn sheet metal). A screwed connection 83' is located on the side of the metal housing 40 which faces away from the substrate 20 and the circuit boards 50, 70. This screwed connection 83' connects the metal housing 40 to the baseplate 30. The metal housing 40 and the baseplate 30 make contact with one another directly.

Figure 2:
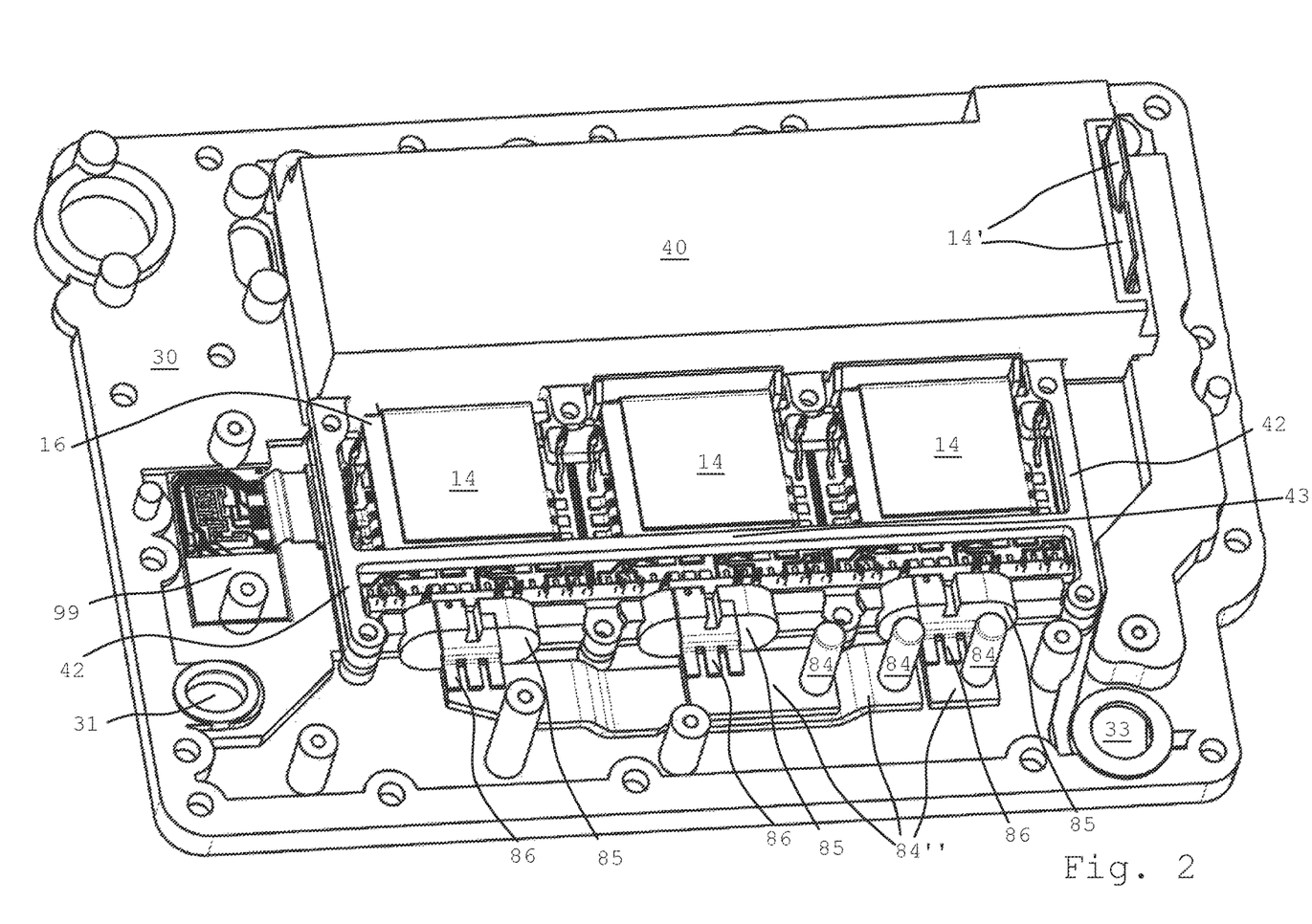

FIG. 2 shows part of the inverter from FIG. 1 and illustrates the baseplate 30. The latter has two cooling duct connections 31 and 33 which are provided as openings in the baseplate. The connections 31, 32 are connected to the cutouts in the baseplate 30 which form the cooling duct (for the DC-link capacitor 10 and/or for the heatsink 32). The sections 14' of the capacitor connecting plates 14 which run through the metal housing 40 of the DC-link capacitor 10 can also be seen here. It is also to be noted that the metal housing 40 has a slit through which the sections 14' of the capacitor connecting plates 14 extend. In addition, as shown the capacitor connecting plates 14 extend over a large part of the substrate. The upper capacitor plate 14, which rests on the insulation layer 16, can be seen. In addition, it is possible to see connecting legs of the circuit breakers 20 which extend underneath the capacitor connecting plates 14 from the circuit breakers to the substrate 20, in order to be attached there by surface soldering technology.

In addition, FIG. 2 shows part of the frame 85 through which the electrical connections 84' extend from the substrate to the power connections 84. First connecting plates 86, which extend from the substrate 20 through the frame 85, are provided. The connecting plates 86 end at further connecting plates 84'' which extend outside the frame 85 to the power connections 84. The plates 86 or conductor strips which extend through the frame 85 may be welded or soldered to the plates 84'' which are located on the outside (the plates 84'' may be conductor strips). The connecting plates 86 which extend through the frame 85 may be soldered onto the substrate.

Furthermore, arms 42 are illustrated which extend from the housing 40 of the DC-link capacitor 10 in the direction of the substrate 20. The arms 42 extend laterally along the substrate 22 or along the circuit breakers 20 and project laterally beyond the latter. At the ends of the arms 42 which are opposite the metal housings 40 there are connecting elements in the form of through holes. Therefore, screwed connections can be provided which secure the ends of the arms 42 to the baseplate 30 and/or to the frame 85. In addition, holes are accommodated on sections of the arms 42. The holes are located directly on the metal housing 40, in order likewise to secure these sections of the arms to the baseplate and/or to the frame 85. The arms 42 extend perpendicularly with respect to the metal housing 40 (and parallel to the baseplate 30). A mechanical cross-connection 43 between the arms 42 connects the arms 42 which extend from opposite ends of one side of the metal housing 40 and extend away from the latter. The cross-connection connects central sections of the arms 42 to one another. The cross-connection and the arms 42 can be embodied as one body. In addition, the arms 42 (and also the cross-connection) can form a common machine part together with the metal housing 40. The arms 42 and the cross-connection serve to increase the vibration resistance of the presented inverter.

An additional circuit 99 is also accommodated on the baseplate 30 which is illustrated in FIG. 2. The latter can serve, for example, for discharging the DC-link capacitor 10 within the metal housing 40. For this purpose, the additional circuit 99 may be connected to the substrate 22 and/or to the DC-link capacitor 10. The additional circuit 99 may be an equipped circuit board and may be attached to the substrate via an electrical connection. The additional circuit 99 is located next to the substrate 22 on a side of the substrate which is perpendicular with respect to a side of the substrate which is adjoined by the DC-link capacitor.

Figure 3:
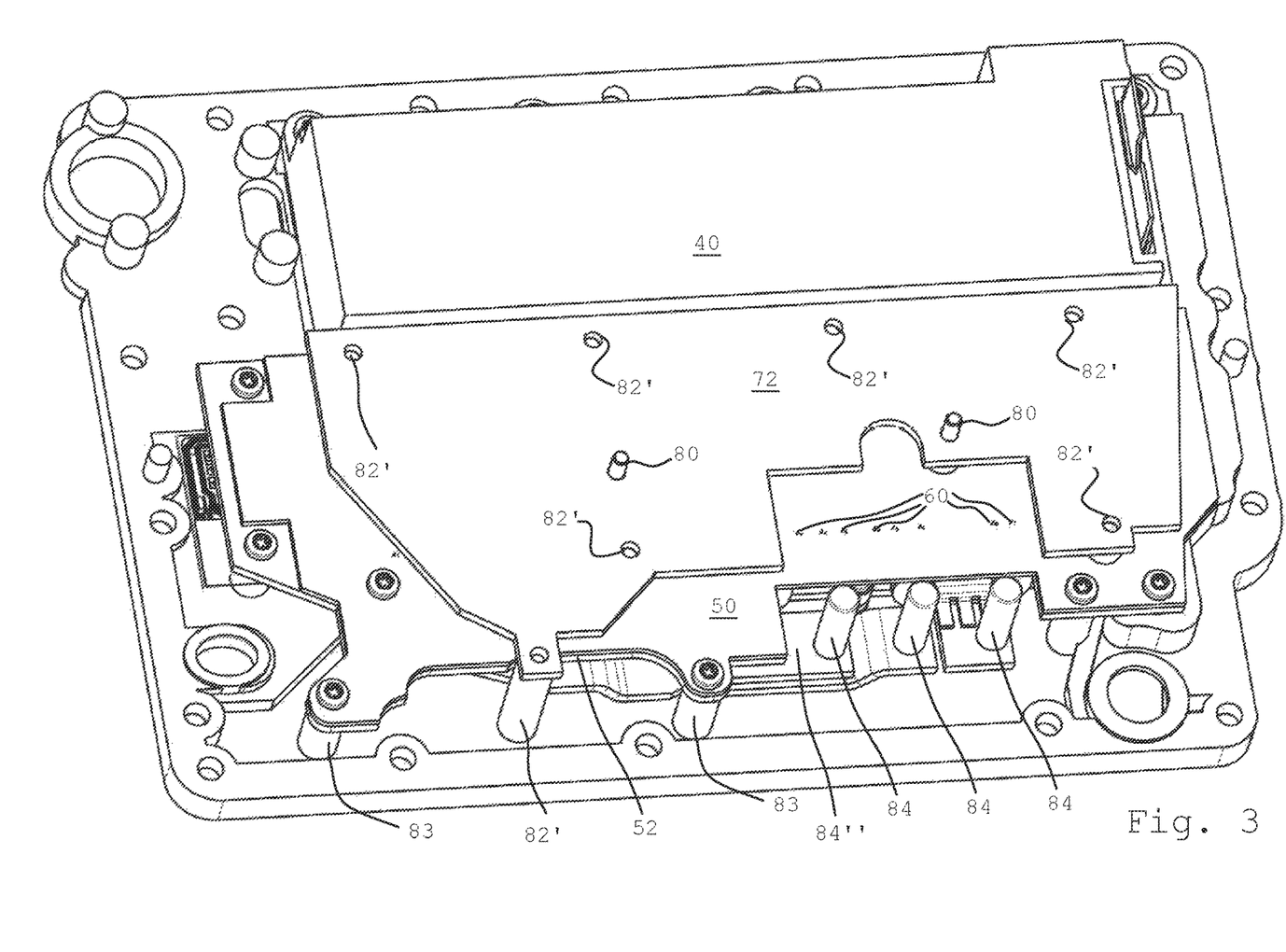

FIG. 3 illustrates further parts of the electric motor inverter in FIGS. 1 and 2 and shows the metal housing 40 of the DC-link capacitor 10. In addition, a carrier plate 72 to which the control circuit board 70 (not illustrated) is secured is shown. The carrier plate 72 of the control circuit board 70 is connected directly to the baseplate via a spacer bolt or threaded bolt. In the same way, the driver circuit board 50 or the carrier plate 52 thereof is secured directly to the baseplate via spacer bolts or else threaded bolts. In this context, the driver circuit board 50 is secured to an associated carrier plate 52, where these two components are attached together to the baseplate by screwed connections. The screwed connections mentioned in this paragraph secure, for example, edge regions of the circuit boards 50, 70, or the carrier plates 52, 72 thereof or else tongues projecting away from the latter. The screwed connections which secure the driver circuit board 50 to the baseplate 30 are illustrated with the reference number 83, while the screwed connections which directly connect the control circuit board or the carrier plate 72 thereof to the baseplate referenced by the reference number 82'.

There are also screwed connections 80 which directly connect the center regions of the circuit boards 50 and 70 to one another. The screwed connections 80 are provided outside edge regions and therefore at a central region of the circuit boards 50, 70. In some examples, the screwed connections 80 are positioned at the location where maximum deflections of the circuit boards or the carrier plates thereof would occur in the case of vibrations (if there were no screwed connections 80). It is apparent that the screwed connections 80 may be attached not only to the single point where the maximum deflections would occur but also that an arrangement in the regions which are located between the screwed connections 82' has the same effect.

In addition, press-fit connections 60 which connect the driver circuit board 50 to the substrate are illustrated. Only those sections of these press-fit connections which project through the circuit board 50 due to the plug-through technology used are shown.

While the substrate may be a ceramic layer or plastic layer which is applied to the heatsink, or else as a physically independent circuit board, the circuit boards 50 and 70 may be physically independent circuit boards which have an insulation layer and at least one conduction layer. The circuit boards 50 and 70 may be plastic-resin-based circuit boards, compound circuit boards, fiber-reinforced circuit boards, or ceramic conductor plates. The substrate may be, inter alia, like the circuit boards, where the term substrate (as a carrier of the circuit breakers) is also used for the sake of differentiation from the circuit boards (as a carrier of driver circuits and control circuits). The substrate carries the power semiconductors, while the circuit boards carry a driver circuit or a control circuit. The control circuit board 70 can have, for example, a microprocessor and is configured to convert microprocessor commands into control signals. The driver circuit board is configured to generate driver signals which can be output directly to control inputs of the circuit breakers of the substrate. The driver circuit board is also designed to receive control signals from the control circuit board.

A further control circuit board may be provided which is located on the metal housing 40 of the DC-link capacitor or which is located on the housing of the EMC filter.

A number of implementations have been described. Nevertheless, it will be understood that various modifications may be made without departing from the spirit and scope of the disclosure. Accordingly, other implementations are within the scope of the following claims.

What is claimed is:

1. An electric motor inverter comprising: at least one DC-link capacitor having contacting layers; circuit breakers mounted on at least one substrate; and capacitor connecting plates having first sections and second sections, the first sections attached to the contacting layers, the second sections arranged opposite the first sections and attached to the at least one substrate; and a baseplate, wherein the second sections of the DC-link capacitor and the substrate are attached one next to the other on the baseplate; a heatsink which is at least partially let into a cutout in the baseplate, and which has a rear side on which the substrate is attached, the baseplate includes a cover plate which closes off the cutout in a seal-forming manner on the same side of the baseplate which is arranged opposite the substrate, with the result that a fluid-tight cooling duct is produced between the front side of the heatsink and the cover plate.

2. The electric motor inverter of claim 1, wherein the capacitor connecting plates have sections at which they lie one on top of the other and are isolated from one another by an insulation layer.

3. The electric motor inverter of claim 1, further comprising: a baseplate, wherein the DC-link capacitor and the substrate are attached one next to the other on the baseplate.

4. The electric motor inverter of claim 3, wherein the heatsink includes cooling pins or cooling fins which extend in the cutout from a front side, arranged opposite the rear side, of the heatsink.

5. The electric motor inverter of claim 1, wherein the DC-link capacitor is arranged in a metal housing which is adjoined by arms which extend from the metal housing over at least one section of the substrate and are connected in a force-transmitting fashion to the substrate.

6. The electric motor inverter of claim 1, further comprising a driver circuit board which has a driver circuit for the circuit breakers arranged downstream, wherein the driver circuit board extends along the substrate with a perpendicular offset with respect thereto, and wherein the driver circuit board is secured on a carrier plate.

7. The electric motor inverter of claim 6, wherein at least one cutout, through which at least one press-fit connection extends from the driver circuit board to the substrate, is positioned in the carrier plate on which the driver circuit board is secured.

8. The electric motor inverter of claim 6, further comprising: a control circuit board, downstream of which the driver circuit board is arranged, wherein the control circuit board extends along the substrate, with a perpendicular offset with respect thereto, and the driver circuit board and the control circuit board are stacked one on top of the other and are spaced apart from one another, and wherein the control circuit board is secured on a further carrier plate.

9. The electric motor inverter of claim 8, wherein the control circuit board by at least one first screwed connection is secured on the driver circuit board by at least one first screwed connection, and the control circuit board is secured by second screwed connections, directly on a baseplate on which the DC-link capacitor and the substrate are arranged one next to the other, wherein the at least one first screwed connection is located in the center between two of the screwed connections.

10. The electric motor inverter of claim 1, further comprising an EMC filter arranged on one side of the DC-link capacitor and which is arranged offset along the contacting layers.

* * * * *